United States Patent
Wu et al.

(10) Patent No.: US 10,923,673 B2
(45) Date of Patent: Feb. 16, 2021

(54) ORGANIC LIGHT EMITTING PANEL, MANUFACTURING METHOD THEREOF, AND ORGANIC LIGHT EMITTING DEVICE

(71) Applicant: BOE TECHNOLOGY GROUP CO., LTD., Beijing (CN)

(72) Inventors: Chang Yen Wu, Beijing (CN); Wei Quan, Beijing (CN); Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/045,818

(22) Filed: Jul. 26, 2018

(65) Prior Publication Data
US 2019/0044088 A1    Feb. 7, 2019

(30) Foreign Application Priority Data

Aug. 2, 2017    (CN) .......................... 2017 1 0652477

(51) Int. Cl.
*H01L 51/52*    (2006.01)
*H01L 51/56*    (2006.01)
*H01L 51/00*    (2006.01)
*H01L 51/50*    (2006.01)

(52) U.S. Cl.
CPC ...... *H01L 51/5203* (2013.01); *H01L 51/0021* (2013.01); *H01L 51/5036* (2013.01); *H01L 51/5215* (2013.01); *H01L 51/5234* (2013.01); *H01L 51/56* (2013.01); *H01L 2251/308* (2013.01); *H01L 2251/5315* (2013.01)

(58) Field of Classification Search
CPC . H01L 51/5215; H01L 51/0021; H01L 51/56; H01L 51/5234; H01L 51/5218; H01L 2251/308; H01L 27/3209; H01L 2251/305; H01L 33/42; H01L 2933/0016
See application file for complete search history.

(56) References Cited

U.S. PATENT DOCUMENTS

| | | | |
|---|---|---|---|
| 10,103,349 B2 * | 10/2018 | Wu | .......................... H01L 51/56 |
| 2002/0117962 A1 | 8/2002 | Beierlein et al. | |
| 2004/0140198 A1 | 7/2004 | Cho et al. | |

(Continued)

FOREIGN PATENT DOCUMENTS

| CN | 1447630 A | 10/2003 |
|---|---|---|
| CN | 1484323 A | 3/2004 |

(Continued)

OTHER PUBLICATIONS

First Office Action for Chinese Patent Application No. 201710652477.1 dated Sep. 5, 2018.

(Continued)

*Primary Examiner* — Yu Chen
(74) *Attorney, Agent, or Firm* — Calfee, Halter & Griswold LLP

(57) ABSTRACT

The present disclosure relates to an organic light emitting panel, including: an organic layer, a first electrode disposed on one side of the organic layer, and a second electrode disposed on the other side of the organic layer. The second electrode includes a buffer electrode layer and a conductive electrode layer sequentially stacked on the organic layer.

7 Claims, 2 Drawing Sheets

(56) References Cited

U.S. PATENT DOCUMENTS

| | | | |
|---|---|---|---|
| 2004/0232828 A1* | 11/2004 | Kimura | H01L 27/3209 313/504 |
| 2009/0242887 A1* | 10/2009 | Yamamoto | C23C 14/086 257/59 |
| 2014/0026952 A1* | 1/2014 | Kim | H01L 31/022466 136/256 |
| 2014/0349432 A1* | 11/2014 | Aonuma | H01L 51/0021 438/46 |
| 2015/0108512 A1 | 4/2015 | Shimayama | |
| 2015/0221893 A1 | 8/2015 | Teraguchi et al. | |
| 2015/0255757 A1* | 9/2015 | Dekkers | C23C 14/024 257/40 |
| 2016/0104860 A1* | 4/2016 | Yasukawa | H01L 51/5044 257/40 |
| 2017/0187003 A1* | 6/2017 | Lei | H01L 51/5275 |
| 2019/0051464 A1* | 2/2019 | Gotanda | H01L 51/5092 |

FOREIGN PATENT DOCUMENTS

| | | |
|---|---|---|
| CN | 101960639 A | 1/2011 |
| CN | 103325812 A | 9/2013 |
| CN | 104167508 A | 11/2014 |
| CN | 104299980 A | 1/2015 |
| CN | 104377306 A | 2/2015 |
| CN | 104517992 A | 4/2015 |
| CN | 105132875 A | 12/2015 |
| CN | 107561054 A | 1/2018 |
| WO | 2006068427 A1 | 6/2006 |

OTHER PUBLICATIONS

Third Office Action for Chinese Patent Application No. 201710652477.1 dated Jan. 19, 2020.

\* cited by examiner

ORGANIC LIGHT EMITTING PANEL, MANUFACTURING METHOD THEREOF, AND ORGANIC LIGHT EMITTING DEVICE

CROSS REFERENCE

This application is based upon and claims priority to Chinese Patent Application No. 201710652477.1, filed on Aug. 2, 2017, the entire contents thereof are incorporated herein by reference.

TECHNICAL FIELD

The disclosure relates to the field of display technology, and in particular, to an organic light emitting panel and a manufacturing method thereof, and an organic light emitting device.

BACKGROUND

In recent years, application of top-emitting white light devices has entered the commercialization stage. It has been reported that a top-emitting white light device combined with a color filter may be utilized to manufacture a 3.0-inch full-color display prototype on a low-temperature polysilicon active drive panel with a resolution of 308 ppi, which is the highest resolution among the same type of display devices currently reported. It indicates that the top-emitting white light device in combination with the color filter has a great potential in preparation of large-size, high-definition, full-color display devices with this method. However, at present, there are still many problems in terms of device efficiency, lifespan, and stability of organic materials used, which restricts the application of top-emitting white light devices.

As the demand for PPI (Pixels Per Inch) is getting higher and higher, the organic display panel is gradually developed toward the top-emitting white light device. However, the top-emitting white light device is commonly used in transparent electrode technology, and the transparent electrode technology may often damage the panel, reduce the yield rate and electrical performance.

SUMMARY

A first aspect of the present disclosure provides an organic light emitting panel, including: an organic layer, a first electrode disposed on one side of the organic layer, and a second electrode disposed on the other side of the organic layer; wherein the second electrode includes: a buffer electrode layer and a conductive electrode layer sequentially stacked on the organic layer. In an exemplary embodiment, a value of a block resistance of the buffer electrode layer is greater than that of the conductive electrode layer.

In an exemplary embodiment, an oxygen ratio of the buffer electrode layer is greater than that of the conductive electrode layer.

In an exemplary embodiment, a thickness of the buffer electrode layer is smaller than that of the conductive electrode layer In an exemplary embodiment, the buffer electrode layer and the conductive electrode layer have the same type of element.

Optionally, the buffer electrode layer and the conductive electrode layer are each made of transparent conductive oxide.

In an exemplary embodiment, the buffer electrode layer has a thickness of 20 nm to 100 nm, the conductive electrode layer has a thickness of 100 nm to 300 nm, and the buffer electrode layer has a higher resistivity greater than 0.1 ohm*cm.

In an exemplary embodiment, a value of a block resistance of the buffer electrode layer is 0.9 GΩ/□ to 1.1 GΩ/□, and a value of a block resistance of the conductive electrode layer is 14Ω/□ to 16 Ω/□.

Optionally, a reflective layer is further provided on a side of the first electrode away from the organic layer.

In an exemplary embodiment, the reflective layer is made of a metal material.

Optionally, the first electrode and the second electrode are each made of a transparent conductive oxide.

Optionally, the first electrode includes a compound composed of indium, tin, and oxygen, and the second electrode includes a compound composed of indium, zinc, and oxygen.

Optionally, light emitted by the organic layer is led out through the second electrode.

Optionally, the organic layer emits white light.

A second aspect of the present disclosure provides a method for manufacturing an organic light emitting panel, including:

forming a first electrode on a substrate;

forming an organic layer on the first electrode;

sputtering a second electrode on the organic layer, wherein the second electrode includes a buffer electrode layer and a conductive electrode layer sequentially stacked on the organic layer.

In an exemplary embodiment, the manufacturing process conditions buffer electrode layer includes: a sputtering power of 0.9 to 1.1 kW, an argon (Ar) flow rate of 430 to 470 sccm (standard condition ml per minute), and an oxygen flow rate of 4.3 to 11. 4.7 sccm, an air pressure of 3.0~3.2 pa; and the manufacturing process conditions for the conductive electrode layer includes: a sputtering power of 2.1 to 2.5 kw, an argon flow rate of 68 to 72 sccm, and an air pressure of 0.65~0.69 pa.

In an exemplary embodiment, the buffer electrode layer and the conductive electrode layer are each made by DC magnetron reactive sputtering.

A third aspect of the present disclosure provides an organic light emitting device including the organic light emitting panel according to any of the above technical solutions.

In order to improve the process yield of the organic light-emitting panel, the inventors of the present invention considered fabricating a metal oxide barrier layer or using laser drilling to solve the negative effects of the sputtering process, but these methods have complicated processes and higher cost.

These and other aspects of the present disclosure will be more apparent from the description of the following embodiments.

DETAILED DESCRIPTION

Figure 1:
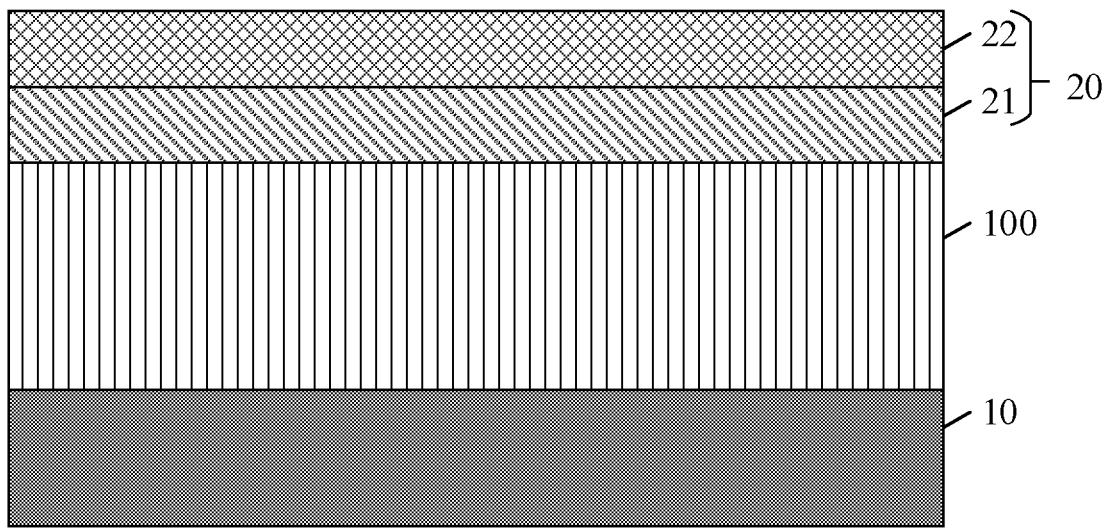
FIG. 1 is a schematic structural diagram of an organic light emitting panel provided by the present disclosure.

The present disclosure will be further described with reference to the accompanying drawings and exemplary embodiments, wherein like reference numerals refer to like parts throughout the drawings. In addition, detailed descriptions of known techniques are omitted if they are not necessary to illustrate the features of the present disclosure.

The present disclosure provides an organic light emitting panel. A schematic structural diagram thereof is shown in FIG. 1. The organic light emitting panel includes an organic layer 100, a first electrode 10 disposed on one side of the organic layer, and a second electrode 20 disposed on another side of the organic layer. The second electrode 20 includes a buffer electrode layer 21 and a conductive electrode layer 22 sequentially stacked on the organic layer.

The second electrode is configured as a two-layer structure including a buffer electrode layer 21 and a conductive electrode layer 22. With the multi-layered composite second electrode, it can achieve white light reflection covering most of the visible light region, and improve the spectral distribution and viewing angle characteristics during top emission of white light.

In an exemplary embodiment, the manufacturing processes of the buffer electrode layer and the conductive electrode layer are the same and the types of the constituent elements are the same. For the buffer electrode layer and the conductive layer, the manufacturing processes are the same, that is, the types of the parameters are the same, but the values of the parameters are different. The types of constituent elements of the buffer electrode layer and the conductive electrode layer are the same, but by adjusting the process parameters, such as increasing the proportion of one of the elements, changing the air pressure or the like, the buffer electrode layer and the conductive electrode layer may have different transmittances and different block resistances.

The difference in process parameters causes the two layers in the second electrode to have the same types of constituent elements, but respectively form a high-resistance buffer electrode layer and a high-conductivity conductive electrode layer.

The buffer electrode layer provided in the embodiment of the present disclosure has a thickness of 20 nm to 100 nm, the conductive electrode layer has a thickness of 100 nm to 300 nm, and the block resistance of the buffer electrode layer has a resistance of 0.9 GΩ/□ to 1.1 GΩ/□, the block resistance of the conductive electrode layer has a resistance of 14Ω/□ to 16 Ω/□.

The manufacturing process conditions for the buffer electrode layer include a sputtering power of 0.9-1.1 kw, an argon flow rate of 430-470 sccm (standard condition ml per minute), an oxygen flow rate of 4.3-4.7 sccm, and an air pressure of 3.0-3.2 pa. In one exemplary embodiment, the buffer electrode layer may be formed into a uniform structure. The manufacturing process conditions for the buffer layer in this embodiment may include: a sputtering power of 1 kw, an argon flow rate of 450 sccm, an oxygen flow rate of 4.5 sccm, and an air pressure of 3.1 pa, resulting in a resistivity greater than 0.1 ohm*cm. In the embodiment of the present disclosure, a buffer electrode layer with a thickness of 50 nm may be formed, and the resistance of the block resistance may reach 1 GΩ/□. In another exemplary embodiment, the buffer electrode layer may be formed into a gradual structure, and the manufacturing process conditions may change gradually. The manufacturing process conditions for the buffer layer in this embodiment may include: a sputtering power changes gradually within a range of 1-2 kw, an argon flow rate changes gradually within a range of 190-450 sccm, an oxygen flow rate changes gradually with a range of 1.9-4.5 sccm, and an air pressure changes gradually within a range of 1.60-3.1 pa.

With respect to the buffer electrode layer, the conductive electrode layer can be fabricated by reducing the block resistance so that the oxygen ratio of the conductive electrode layer is smaller than that of the buffer electrode layer, by reducing the oxygen ratio, reducing the gas pressure, etc. The manufacturing process conditions of the conductive electrode layer include: a sputtering power of 2.1-2.5 kw, an argon flow rate of 68~72 sccm, an oxygen flow rate of 0.1-1 sccm, and an air pressure of 0.65~0.69 pa. In this embodiment, the manufacturing process conditions of the conductive electrode layer may include a sputtering power of 2.3 kw, an Ar flow rate of 70 sccm, an oxygen flow rate of 0.4 sccm, and a gas pressure of 0.67 pa, forming a conductive electrode layer with a higher conductive rate. In the embodiment of the present disclosure, the conductive electrode layer may have a thickness of 250 nm, a block resistance value of 15Ω/□, the same as the block resistance value of a common electrode with a thickness of 300 nm.

Optionally, the buffer electrode layer and the conductive electrode layer are all transparent electrode layers, that is, the second electrode layer is a transparent electrode layer, and the first electrode layer may be a non-transparent electrode layer. A translucent organic light emitting panel may be formed.

The materials of the buffer electrode layer and the conductive electrode layer are all transparent conductive oxides (TCO), including In, Tin, Zinc, F, Al, etc., and a mixture thereof. The transparent material has a high light transmittance and a low resistance. Light emitted from the organic layer is favorably led out from the second electrode side.

In another embodiment, the first electrode and the second electrode are both transparent conductive oxide (TCO) materials.

The transparent conductive oxide film has the advantages of high light transmittance, low resistivity, etc. Both of the first electrode and the second electrode are made of such a material, it may facilitate the emission of light from the first electrode side or the second electrode side.

Figure 2:
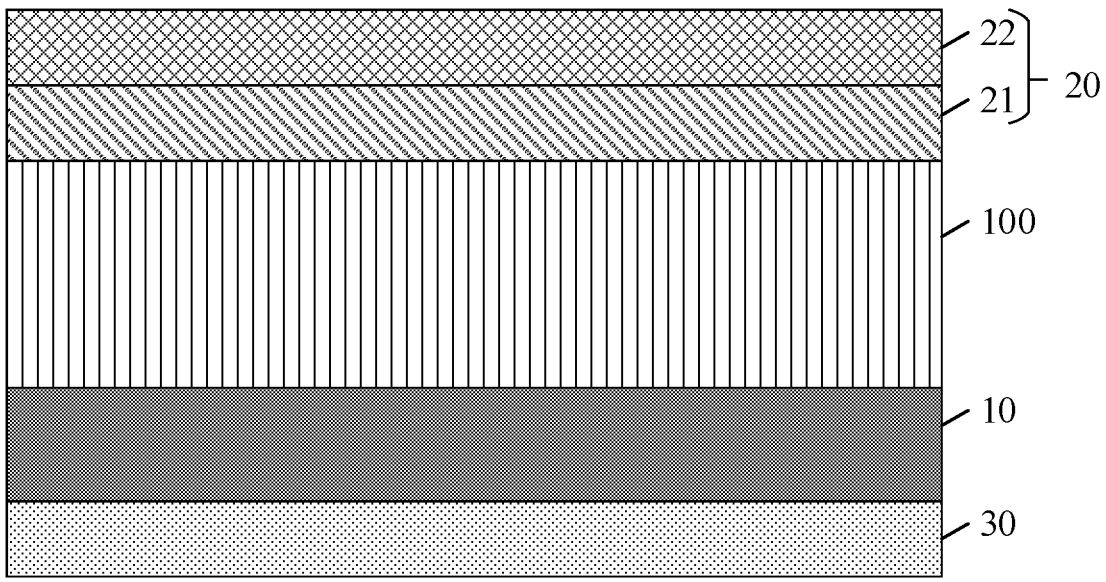
FIG. 2 is a schematic structural diagram of an organic light emitting panel including an emission layer provided by the present disclosure.

In the present disclosure, a reflective layer 30 is further provided on the side of the first electrode away from the organic layer. The exemplary structure is shown in FIG. 2. In an exemplary embodiment, the material of the reflective layer is a metal material, such as: Ag, Al, Mg, Li, etc., or a mixture of the metals, or an alloy containing the metal material. The thickness of the reflective layer is in the range of 90 nm to 110 nm, and the thickness of the reflective layer may be 100 nm.

Due to the extremely high reflectivity of the metallic material, the absorption of light by the reflective layer and the first electrode can be weakened, and the loss of light can be reduced. The provision of the reflective layer can achieve a better reflection effect, and the light emitted from the light emitting layer provided in the organic layer can be emitted from the second electrode side as much as possible.

In another embodiment, the first electrode includes a compound composed of indium, tin, and oxygen (ITO), and the second electrode includes a compound composed of indium, zinc, and oxygen (IZO).

Tin-doped indium oxide (ITO), which is a compound containing indium, tin, and oxygen, is a representative of a transparent conductive oxide film. It also has the advantages of high light transmittance and low resistivity, thereby it can reduce the loss of light through the layer. Compared with ITO, IZO material has a higher light transmittance and a smoother surface, which is advantageous for fabricating top-gate thin-film transistors.

In principle, the light emitted by the organic layer may be led out through the first electrode or through the second electrode. The light emitted from the first electrode may be referred to as bottom emission. In this embodiment, the light is led out through the second electrode, that is, top emission. The top emission has a larger light emitting area than the bottom emission, so the top emission can be more favorable for achieving high resolution than the bottom emission.

The second electrode is bonded with a reflective layer disposed on the other side of the first electrode with IZO material to increase the light emission rate from the second electrode.

Optionally, the light emitted by the organic layer is white light.

Compared with the organic layer emitting three colors of red, green and blue, the white organic light emitting device has a high resolution and a wide color gradation, but the white light emitting device has a wider chromatogram. It can be achieved by forming a plurality of organic light emitting materials that respectively emit red, green, and blue lights in the organic light emitting layer, or by forming two organic light emitting materials having a pair of complementary color relationships. For a white light display panel, color display may be obtained by utilizing a color filter. In this case, the structure of all the sub-pixel organic light emitting layers can be similarly formed, so it is relatively easy to manufacture a large-area, high-resolution display device.

Figure 3:
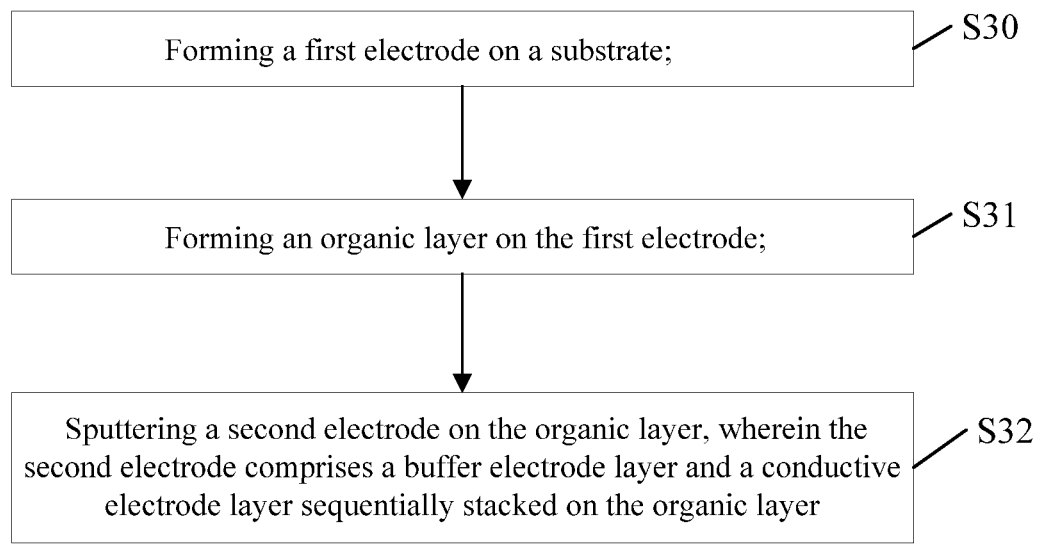
FIG. 3 is a schematic flow chart of a method for manufacturing an organic light emitting panel provided by the present disclosure.

Correspondingly, the present disclosure also provides a method for manufacturing an organic light emitting panel. Referring to FIG. 3, the exemplary steps of the method include the following.

In S30, a first electrode is formed on the substrate.

The substrate is a glass substrate or a flexible substrate. The embodiment of the present disclosure as an example, utilizes a flexible substrate, such as a plastic substrate, on which a first electrode is formed by a technique well known to those skilled in the art, and the first electrode is made of transparent conductive oxide.

Further, before forming the first electrode on the substrate, a reflective layer is formed on the substrate, and the reflective layer is made of a metal material or a mixture thereof and an alloy containing the metal material. A reflective layer is formed between the first electrode and the substrate in order to utilize the high reflectivity of the metal material to weaken the absorption of light by the reflective layer and the first electrode, thereby minimizing the loss of light.

In S31, an organic layer is formed on the first electrode.

An organic layer containing a light emitting layer is formed on the first electrode, and the organic layer is stacked on the first electrode in the following order: a hole injection layer, a hole transport layer, a light emitting layer, and an electron transport layer. The light emitted by the light emitting layer of the present disclosure may be white light.

In S32: a second electrode is sputtered on the organic layer. The second electrode includes a buffer electrode layer and a conductive electrode layer sequentially stacked on the organic layer.

In an exemplary embodiment, both the buffer layer and the conductive electrode layer are formed by DC magnetron reactive sputtering method.

Prior to sputtering, the substrate has been processed through steps S30 and S31 is pre-heated by a heating plate to a desired temperature for sputtering. Then the substrate is fed to a SP chamber, with the platen rotated to a vertical film forming position. Under the action of argon (Ar) introduction and the condensate pump exhaust, the chamber reaches a stable working pressure. The cathode is applied with a DC power, the argon (Ar) is ionized. The argon ions (Ar+) are incident on the target surface, and the target particles are deposited on the substrate to form a film. In an exemplary embodiment, the manufacturing process conditions for the buffer electrode layer include: a sputtering power of 1 kw, an argon flow rate of 450 standard milliliters per minute (sccm), an oxygen flow rate of 4.5 standard milliliters per minute (sccm), and an air pressure of 3.1 pa. The manufacturing process conditions for the conductive electrode layer include a sputtering power of 2.3 kw, an Ar flow of 70 sccm, and an air pressure of 0.67 pa.

The buffer electrode layer and the conductive electrode layer are of the same types of constituent elements, but with different manufacturing process conditions. Therefore, it can form electrode layers (i.e., the buffer electrode layer having high resistance and the conductive electrode layer having high conductivity) having two types of performances from the same target material.

The process parameters of the sputtering process can be easily controlled and the prepared oxide film can be of good quality. The sputtering process has a strong binding force between the electroplating layer and the substrate, and the electroplating layer is dense and uniform. The sputtering process has no special requirements on the position of the target material and the substrate, and the target material can have a long service life and can serve for automatic and continuous production for a long time.

Moreover, the DC magnetron sputtering film described in the embodiments of the present disclosure adopts a planar target, does not require an external complex network matching device and an expensive radio frequency power supply device, thereby it can reduce the production cost. Moreover, since sputtering electrons only fall on the substrate when their energy is exhausted, the substrate temperature can rise slowly.

In order that the material that is not resistant to high temperature in the organic light emitting panel is not damaged, in the present disclosure, optionally, an annealing process is not performed, and the transparent material IZO is of an amorphous structure. Performing the annealing process has little effect on light transmittance, resistivity, and the like.

In the process of sputtering the display panel, the display device may be easily damaged and made leaking current due to the high temperature. Once the leakage point occurs in the device, the brightness of the pixel will decrease, which will negatively affect the brightness uniformity and power consumption of the entire panel. However, in the present disclosure, the second electrode is set to a two-layer structure by adjusting the process parameters, of which the buffer electrode layer has a high resistance, and the buffer electrode layer has a resistance higher than the resistance of the light emitting device, and is much higher than the resistance at leakage point. Therefore, even if there is a leakage point occurs in the light emitting device, the current flowing through the pixel cannot be greatly affected, and the brightness and power consumption of the panel as a whole cannot be greatly affected.

Correspondingly, the present disclosure further provides an organic light emitting device, which includes the organic light emitting panel according to any one of the preceding technical solutions. The organic light emitting device may be an electronic paper, a display panel, an OLED panel, a mobile phone, or a tablet computer, a television, a monitor, a laptop, a digital photo frame, a navigator, and other products or components that have display capabilities.

Since the organic light emitting device is improved on the basis of the organic light emitting panel, the organic light emitting device naturally inherits all the advantages of the organic light emitting panel.

In view of the above, according to the multi-layered structure of the second electrode of the organic light emitting panel provided by the present disclosure, of which the second electrode includes a buffer electrode layer and a conductive electrode layer, due to the high resistance property of the buffer electrode layer, it can reduce the decrease in brightness and increase in power consumption caused by the leakage of current. In addition, since the buffer electrode layer and the conductive electrode layer have the same manufacturing process and same types of constituent elements, the same material target material, the same process chamber and the same manufacturing process can be utilized, to reduce the production cost of the organic light emitting panel.

Although several exemplary embodiments of the present disclosure have been described above, those skilled in the art should understand that modifications may be made to these exemplary embodiments without departing from the principle or spirit of the present disclosure. The scope of the present disclosure is defined by the claims and their equivalents.

What is claimed is:

1. An organic light emitting panel, comprising: an organic layer, a first electrode disposed on one side of the organic layer, and a second electrode disposed on the other side of the organic layer,
wherein the second electrode comprises a buffer electrode layer and a conductive electrode layer sequentially stacked on the organic layer, and the buffer electrode layer is disposed between the conductive electrode layer and the organic layer,
a thickness of the buffer electrode layer is smaller than a thickness of the conductive electrode layer,
the buffer electrode layer has a thickness of 20 nm to 100 nm, and the conductive electrode layer has a thickness of 100 nm to 300 nm,
the buffer electrode layer and the conductive electrode layer have the same type of element,
the buffer electrode layer and the conductive electrode layer are each made of transparent conductive oxide,
the first electrode is formed by a compound composed of indium, tin and oxygen (ITO), and the second electrode is formed by a compound composed of indium, zinc and oxygen (IZO),
an oxygen ratio of the buffer electrode layer is greater than an oxygen ratio of the conductive electrode layer,
a value of a block resistance of the buffer electrode layer is greater than a value of a block resistance of the conductive electrode layer,
the buffer electrode layer has a resistivity greater than 0.1 ohm*cm, and
the value of a block resistance of the buffer electrode layer is 0.9 G $\Omega$/□ to 1.1 G $\Omega$/□, and the value of a block resistance of the conductive electrode layer is 14 $\Omega$/□ to 16 $\Omega$/□.

2. The organic light emitting panel according to claim 1, wherein a reflective layer is further provided on a side of the first electrode away from the organic layer.

3. The organic light emitting panel of claim 1, wherein the organic layer emits white light.

4. An organic light emitting device comprising the organic light emitting panel according to claim 1.

5. A method for manufacturing an organic light emitting panel, comprising:
forming a first electrode on a substrate;
forming an organic layer on the first electrode;
sputtering a second electrode on the organic layer, wherein the second electrode comprises a buffer electrode layer and a conductive electrode layer sequentially stacked on the organic layer,
the buffer electrode layer is disposed between the conductive electrode layer and the organic layer,
a thickness of the buffer electrode layer is smaller than a thickness of the conductive electrode layer,
the buffer electrode layer has a thickness of 20 nm to 100 nm, and the conductive electrode layer has a thickness of 100 nm to 300 nm,
the buffer electrode layer and the conductive electrode layer have the same type of element,
the buffer electrode layer and the conductive electrode layer are each made of transparent conductive oxide,
the first electrode is formed by a compound composed of indium, tin and oxygen (ITO), and the second electrode is formed by a compound composed of indium, zinc and oxygen (IZO),
an oxygen ratio of the buffer electrode layer is greater than an oxygen ratio of the conductive electrode layer,
a value of a block resistance of the buffer electrode layer is greater than a value of a block resistance of the conductive electrode layer,
the buffer electrode layer has a resistivity greater than 0.1 ohm*cm, and
the value of a block resistance of the buffer electrode layer is 0.9 G $\Omega$/□ to 1.1 G $\Omega$/□, and the value of a block resistance of the conductive electrode layer is 14 $\Omega$/□ to 16 •/□.

6. The method for manufacturing a light emitting panel according to claim 5, wherein the manufacturing process conditions buffer electrode layer comprises: a sputtering power of 0.9 to 1.1 kW, an argon flow rate of 430 to 470 sccm, and an oxygen flow rate of 4.3 to 4.7 sccm, an air pressure of 3.0~3.2 pa; and the manufacturing process conditions for the conductive electrode layer comprises: a sputtering power of 2.1 to 2.5 kw, an argon flow rate of 68 to 72 sccm, and an air pressure of 0.65~0.69 pa.

7. The method for manufacturing an organic light emitting panel according to claim 5, wherein the buffer electrode layer and the conductive electrode layer are each made by DC magnetron reactive sputtering.

* * * * *